(12) United States Patent
Brier et al.

(10) Patent No.: US 9,053,275 B2
(45) Date of Patent: Jun. 9, 2015

(54) TECHNIQUES FOR FACILITATING ELECTRICAL DESIGN OF AN ENERGY GENERATION SYSTEM

(75) Inventors: Travis Z. Brier, San Francisco, CA (US); Michael Lazzareschi, San Francisco, CA (US); Peter Rive, San Francisco, CA (US)

(73) Assignee: SolarCity Corporation, San Mateo, CA (US)

(*) Notice: Subject to any disclaimer, the term of this patent is extended or adjusted under 35 U.S.C. 154(b) by 339 days.

(21) Appl. No.: 13/556,025

(22) Filed: Jul. 23, 2012

(65) Prior Publication Data
US 2014/0025344 A1 Jan. 23, 2014

(51) Int. Cl.
*G06F 17/50* (2006.01)
*G06N 5/00* (2006.01)

(52) U.S. Cl.
CPC .............. *G06F 17/5063* (2013.01); *G06N 5/00* (2013.01); *G06F 17/5004* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 6,546,535 B1* | 4/2003 | Nagao et al. | 716/120 |
| 7,512,540 B2* | 3/2009 | Gluck et al. | 705/1.1 |
| 8,352,220 B2* | 1/2013 | Wayne et al. | 703/1 |
| 8,417,061 B2 | 4/2013 | Kennedy et al. | |
| 8,626,616 B2* | 1/2014 | Eich | 705/28 |
| 2008/0071604 A1 | 3/2008 | Scanlan | |
| 2009/0177458 A1 | 7/2009 | Hochart et al. | |
| 2009/0234692 A1 | 9/2009 | Powell et al. | |
| 2009/0304227 A1 | 12/2009 | Kennedy et al. | |
| 2010/0217724 A1 | 8/2010 | Wayne et al. | |
| 2011/0108087 A1 | 5/2011 | Croft et al. | |
| 2013/0061142 A1 | 3/2013 | Brier et al. | |
| 2013/0061189 A1 | 3/2013 | Brier et al. | |
| 2013/0061198 A1 | 3/2013 | Brier et al. | |
| 2014/0025343 A1* | 1/2014 | Gregg et al. | 703/1 |
| 2014/0032178 A1* | 1/2014 | Kicinski et al. | 703/1 |

OTHER PUBLICATIONS

Volkswagen "How to Read Wiring Diagrams: Symbols, Layout, and Navigation" (2001) available at <http://dept.sfcollege.edu/InTech/AUTO/content/courses/AER1698%20materials/How%20to%20read%20wiring%20diagrams.pdf>.*
Shawal, M. & Taib, S. "Development of Expert System as an Evaluation Tool for Photovoltaic Power Supply" IEEE Nat'l Power & Energy Conf., pp. 292-295 (2003).*
U.S. Appl. No. 13/227,139, filed Sep. 11, 2007.
U.S. Appl. No. 13/426,487, filed Mar. 21, 2012.
U.S. Appl. No. 13/426,503, filed Mar. 21, 2012.

(Continued)

*Primary Examiner* — Kamini S Shah
*Assistant Examiner* — Jay B Hann
(74) *Attorney, Agent, or Firm* — Kilpatrick Townsend & Stockton LLP

(57) ABSTRACT

Systems and methods for facilitating the electrical design of an energy generation system. In one embodiment, a method is provided that can comprise receiving, by a computer system from a user, first information pertaining to an energy generation system to be installed at a customer site. The method can further comprise determining an electrical design for installing the energy generation system at the customer site, where the determining is based on the first information, second information retrieved from one or more external data sources, an electrical data model, and a decision tree that models the electrical design process. An installation diagram can then be generated that illustrates the determined electrical design.

20 Claims, 15 Drawing Sheets

(56) References Cited

OTHER PUBLICATIONS

NonFinal Office Action in U.S. Appl. No. 13/426,487, mailed Jun. 23, 2014; 28 pages.

NonFinal Office Action in U.S. Appl. No. 13/426,503, mailed Jul. 10, 2014; 24 pages.

Final Office Action in U.S. Appl. No. 13/227,139, mailed Aug. 1, 2014; 20 pages.

* cited by examiner

TECHNIQUES FOR FACILITATING ELECTRICAL DESIGN OF AN ENERGY GENERATION SYSTEM

BACKGROUND

The present disclosure relates in general to electrical system design, and in particular to techniques for facilitating the electrical design of an energy generation system.

In recent years, climate change concerns, federal/state initiatives, and other factors have driven a rapid rise in the installation of renewable energy generation systems (i.e., systems that generate energy using renewable resources such as solar, wind, hydropower, etc.) at residential and non-residential sites. Photovoltaic (PV) systems, in particular, have been very popular; in 2011, nearly two gigawatts of PV capacity were installed in the United States, and that number is expected to double in 2012. The majority of this PV capacity is "grid-connected"—in other words, tied to the utility-maintained electrical grid. This allows site loads to be serviced from the grid at times when the PV system cannot generate sufficient energy due to lack of sunlight (e.g., at night), while allowing energy to be fed back into the grid at times when PV energy production exceeds site loads (thereby resulting in, e.g., a credit on the site owner's electricity bill).

An important aspect of designing a grid-connected PV system is selecting the electrical components that enable the system to provide power to site loads or the utility grid, as well as defining the electrical connections between the components. Currently, this process is time-consuming and labor-intensive because it must be performed manually by individuals who are specifically trained and/or experienced in electrical system design. Accordingly, it would be desirable to automate the electrical design process so that it can be performed more quickly and efficiently, and without requiring substantial training or experience on the part of the designers.

SUMMARY

Embodiments of the present invention relate to systems and methods for facilitating the electrical design of an energy generation system. According to one embodiment, a method is provided that can comprise receiving, by a computer system from a user, first information pertaining to an energy generation system to be installed at a customer site. The method can further comprise determining an electrical design for installing the energy generation system at the customer site, where the determining is based on the first information, second information retrieved from one or more external data sources, an electrical data model, and a decision tree that models the electrical design process. An installation diagram can then be generated that illustrates the determined electrical design.

In one embodiment, the energy generation system can be a solar photovoltaic (PV) system.

In one embodiment, the first information can be received via a graphical user interface.

In one embodiment, the first information can include information pertaining to one or more direct current (DC) components of the energy generation system.

In one embodiment, the first information can further include information pertaining to one or more alternating current (AC) components of the energy generation system.

In one embodiment, a portion of the first information can be populated with defaults retrieved from the one or more data sources.

In one embodiment, the one or more external data sources can be selected from a group consisting of: an Authority Having Jurisdiction (AHJ) database, a utility database, a state database, and a component supply chain database.

In one embodiment, the electrical data model can comprise a plurality of rules indicating how electrical components of the energy generation system may be interconnected, where the plurality of rules conform to the National Electric Code (NEC).

In one embodiment, determining the electrical design can comprise traversing nodes of the decision tree, where each node represents a question regarding the electrical design or a decision outcome.

In one embodiment, the method can further comprise, for a given node of the decision tree representing a question, determining whether the question can be answered based on the first information or the second information. If the question cannot be answered based on the first information or the second information, the user can be prompted for an answer.

In one embodiment, the electrical design can include information regarding how electrical components of the energy generation system should be interconnected.

In one embodiment, the information regarding how the electrical components should be interconnected can include information regarding conduit to be used between the electrical components.

In one embodiment, the installation diagram can be configured such that AC components of the energy generation system are depicted on one side of the installation diagram and DC components of the energy generation system are depicted on the opposite side of the installation diagram.

In one embodiment, the installation diagram can include a bill of materials.

In one embodiment, the bill of materials can identify make and model numbers for each electrical component of the energy generation system.

In one embodiment, the bill of materials can further identify sizes of wires needed to interconnect the electrical components.

In one embodiment, the installation diagram can be generated using a computer-aided design (CAD) program, and the receiving and determining can be performed by a plug-in module to the CAD program.

According to another embodiment of the present invention, a system is provided that comprises a processor. The processor can be configured to receive, from a user, first information pertaining to an energy generation system to be installed at a customer site; determine an electrical design for installing the energy generation system at the customer site, the determining being based on the first information, second information retrieved from one or more external data sources, an electrical data model, and a decision tree modeling an electrical design process; and generate an installation diagram illustrating the determined electrical design.

According to another embodiment of the present invention, a non-transitory computer-readable storage medium is provided that has stored thereon program code executable by a computer system. The program code can comprise code that causes the computer system to receive, from a user, first information pertaining to an energy generation system to be installed at a customer site; code that causes the computer system to determine an electrical design for installing the energy generation system at the customer site, the determining being based on the first information, second information retrieved from one or more external data sources, an electrical data model, and a decision tree modeling an electrical design process; and code that causes the computer system to generate an installation diagram illustrating the determined electrical design.

A further understanding of the nature and advantages of the embodiments disclosed herein can be realized by reference to the remaining portions of the specification and the attached drawings.

DETAILED DESCRIPTION

Figure 1:
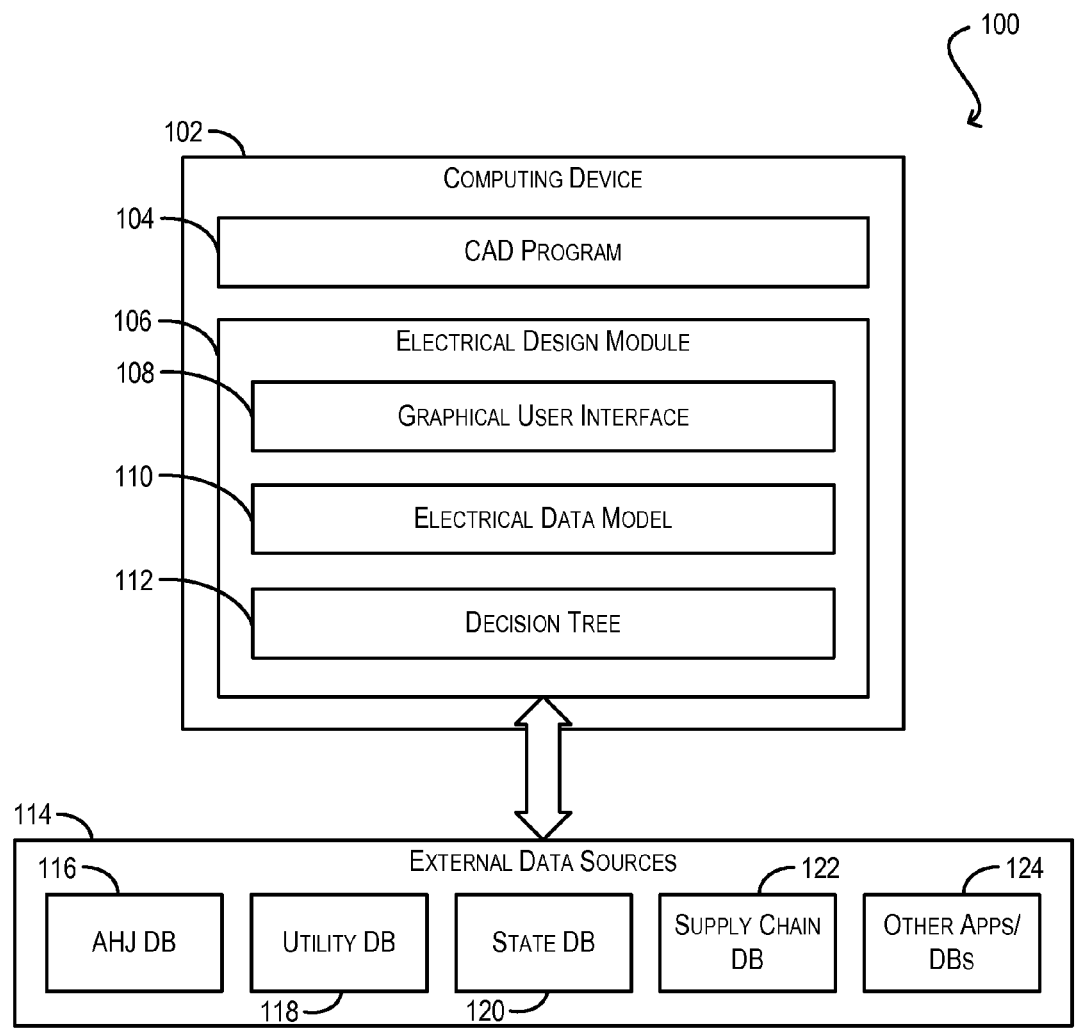
FIG. 1 is a simplified block diagram of a system environment in accordance with an embodiment of the present invention.

In the following description, for purposes of explanation, numerous examples and details are set forth in order to provide an understanding of embodiments of the present invention. It will be evident, however, to one skilled in the art that certain embodiments can be practiced without some of these details, or can be practiced with modifications or equivalents thereof.

Embodiments of the present invention provide a computer-implemented tool for facilitating the electrical design of an energy generation system. In one embodiment, the tool can be implemented as a standalone (e.g., desktop) software application configured to run autonomously on one or more computing devices. In another embodiment, the tool can be implemented as a distributed software application hosted on, e.g., a web or application server. In operation, the tool can generate a graphical user interface configured to request, from a user, initial information pertaining to an energy generation system to be installed at a customer site. Once received, the tool can use the initial information, in conjunction with an electrical data model, a decision tree, and additional information retrieved from one or more external data sources, to determine an electrical design for installing the energy generation system at the customer site. An installation diagram can then be generated that illustrates the determined electrical design.

With the foregoing features, there is no need for an experienced engineer or system designer to manually select each electrical component of a system installation, or manually determine how those components should be interconnected. Instead, all or a part of this process can be automated. Thus, embodiments of the present invention empower a wide range of users, regardless of their technical expertise or experience, to quickly and easily create an electrical system design.

Further, by relying on a standard electrical data model and by retrieving information from external data sources (such as AHJ, utility, and state databases), the tool described above can ensure that the generated electrical design conforms to the various electrical/building requirements (e.g., NEC, AHJ regulations, etc.) that apply to the customer site.

Yet further, the installation diagram generated by the tool can be formatted in a manner that simplifies system installation and component procurement. For example, in one embodiment, direct current (DC) components of the system can be grouped on one side of the diagram and alternating current (AC) components can be grouped on the other side of the diagram, thereby allowing two installation crews to separate the diagram in half and work concurrently on the AC and DC sides respectively. In another embodiment, the diagram can include a bill of materials (BOM) that lists the make and model of each electrical component, as well as the wire sizes needed to interconnect the components. Thus, all of the information needed to procure the electrical components (and their interconnecting wires) from the supply chain can be gleaned directly from the diagram itself, rather than being collected from other sources/locations. In one embodiment, the BOM information can be included in metadata associated with the installation diagram (in addition to being displayed on the diagram). This information can then be transferred directly into, e.g., an inventory management system.

For purposes of illustration, several of the examples and embodiments that follow are described in the context of solar PV systems. However, it should be appreciated that embodiments of the present invention may be applied to other type of energy generation systems (e.g., wind turbine, solar-thermal, geothermal, biomass, hydropower, etc.). One of ordinary skill in the art will recognize various modifications, variations, and alternatives.

FIG. 1 is a simplified block diagram of a system environment 100 according to an embodiment of the present invention. As shown, system environment 100 includes a computing device 102 configured to execute a computer-aided design (CAD) program 104. Computing device 102 is an end-user computing device, such as a desktop computer, a laptop computer, a personal digital assistant, a smartphone, a tablet, or the like. CAD program 104 is a software application that enables the creation of technical and engineering drawings. Examples of such programs include AutoCAD, TurboCAD, and so on. In a particular embodiment, CAD program 104 can be suitable for creating electrical diagrams, such as one-line or three-line diagrams.

Computing device 102 is further configured to execute an electrical design module 106. In certain embodiments, electrical design module 106 can be implemented as a plug-in to CAD program 104, and thus can run in the context of program 104. In other embodiments, electrical design module 106 can be implemented as a separate program that is configured to interface (either programmatically or via data/metadata) with CAD program 104.

Electrical design module 106 can provide various functions for facilitating the electrical design of an energy generation system. For instance, electrical design module 106 can present, to a user of computing device 102, a graphical user interface 108 for entering initial information pertaining to the installation of an energy generation system at a particular site. This information can include, e.g., site electrical requirements, main panel and utility meter information, and the like.

Upon receiving the initial information via GUI 108, electrical design module 106 can automatically determine an electrical design for the energy generation system. As part of this processing, electrical design module 106 can interact with an electrical data model 110 and a decision tree 112. Electrical data model 110 can correspond to a set of data structures and/or rules that define how various electrical components physically connect to each other. In certain embodiments, electrical data model 110 can be configured to conform to one or more electrical standards, such as the National Electric Code (NEC). Decision tree 112 can model a prototypical electrical design process, and thus can exemplify the decision making flow that is typically followed by an experienced engineer/system designer when creating an electrical system design. For example, each node of decision tree 112 can correspond to a decision/question to be resolved with respect to the design, or a corresponding decision outcome. A given path through the tree can define a set of decision outcomes that delineate the content of the final electrical design.

In operation, electrical design module 106 can traverse decision tree 112 and thereby determine, in view of electrical data model 110, what electrical components are needed to implement the energy generation system and how those components should be interconnected. To resolve the decisions/questions presented in decision tree 112, electrical design module 106 can refer to the initial information received via graphical user interface 108, or retrieve additional information from one or more external data sources 114 (e.g., AHJ database 116, utility database 118, state database 120, supply chain database 122, and other applications/databases 124). If a particular decision/question cannot be resolved in view of the initial information or the data stored in external data sources 114, electrical design module 106 can prompt the user of computing device 102 to provide the requisite information.

Once the electrical design has been determined, electrical design module 106 can generate (via CAD program 104) an installation diagram illustrating the design. The installation diagram can then be used for various purposes, such as system installation, component procurement, permit approval, utility rebate submissions, and more.

It should be appreciated that system 100 is illustrative and is not intended to limit embodiments of the present invention. For example, although external data sources 114 are depicted as being remote from computing device 102, in alternative embodiments one or more of data sources 114 may be stored locally on computing device 102. Further, although CAD program 104 and electrical design module 106 are shown as running on the same physical machine (i.e., computing device 102), one of ordinary skill in the art will appreciate that program 104 and module 106 can run on separate machines. Yet further, the various components depicted in system 100 can have other capabilities or include other subcomponents that are not specifically described. One of ordinary skill in the art will recognize many variations, modifications, and alternatives.

Figure 2:
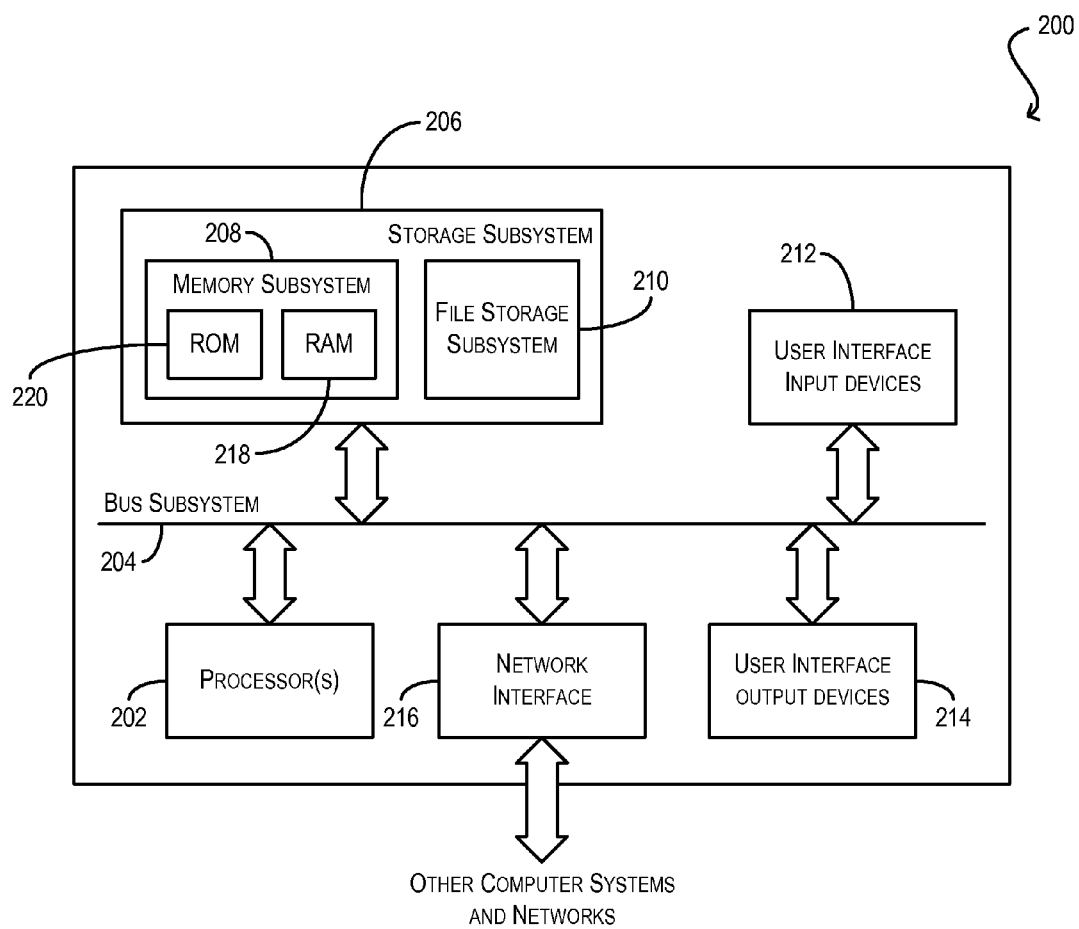
FIG. 2 is a simplified block diagram of a computer system in accordance with an embodiment of the present invention.

FIG. 2 is a simplified block diagram of a computer system 200 according to an embodiment of the present invention. In one embodiment, computer system 200 can be used to implement computing device 102 of FIG. 1. As shown in FIG. 2, computer system 200 can include one or more processors 202 that communicate with a number of peripheral devices via a bus subsystem 204. These peripheral devices can include a storage subsystem 206 (comprising a memory subsystem 208 and a file storage subsystem 210), user interface input devices 212, user interface output devices 214, and a network interface subsystem 216.

Bus subsystem 204 can provide a mechanism for letting the various components and subsystems of computer system 200 communicate with each other as intended. Although bus subsystem 204 is shown schematically as a single bus, alternative embodiments of the bus subsystem can utilize multiple busses.

Network interface subsystem 216 can serve as an interface for communicating data between computer system 200 and other computer systems or networks. Embodiments of network interface subsystem 216 can include, e.g., an Ethernet card, a Wi-Fi and/or cellular adapter, a modem (telephone, satellite, cable, ISDN, etc.), digital subscriber line (DSL) units, and/or the like.

User interface input devices 212 can include a keyboard, pointing devices (e.g., mouse, trackball, touchpad, etc.), a scanner, a barcode scanner, a touch-screen incorporated into a display, audio input devices (e.g., voice recognition systems, microphones, etc.) and other types of input devices. In general, use of the term "input device" is intended to include all possible types of devices and mechanisms for inputting information into computer system 200.

User interface output devices 214 can include a display subsystem, a printer, a fax machine, or non-visual displays such as audio output devices, etc. The display subsystem can be a cathode ray tube (CRT), a flat-panel device such as a liquid crystal display (LCD), or a projection device. In general, use of the term "output device" is intended to include all possible types of devices and mechanisms for outputting information from computer system 200.

Storage subsystem 206 can include a memory subsystem 208 and a file/disk storage subsystem 210. Subsystems 208 and 210 represent non-transitory computer-readable storage media that can store program code and/or data that provide the functionality of embodiments of the present invention.

Memory subsystem 208 can include a number of memories including a main random access memory (RAM) 218 for storage of instructions and data during program execution and a read-only memory (ROM) 220 in which fixed instructions are stored. File storage subsystem 210 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 200 is illustrative and not intended to limit embodiments of the present invention. Many other configurations having more or fewer components than system 200 are possible.

Figure 3:
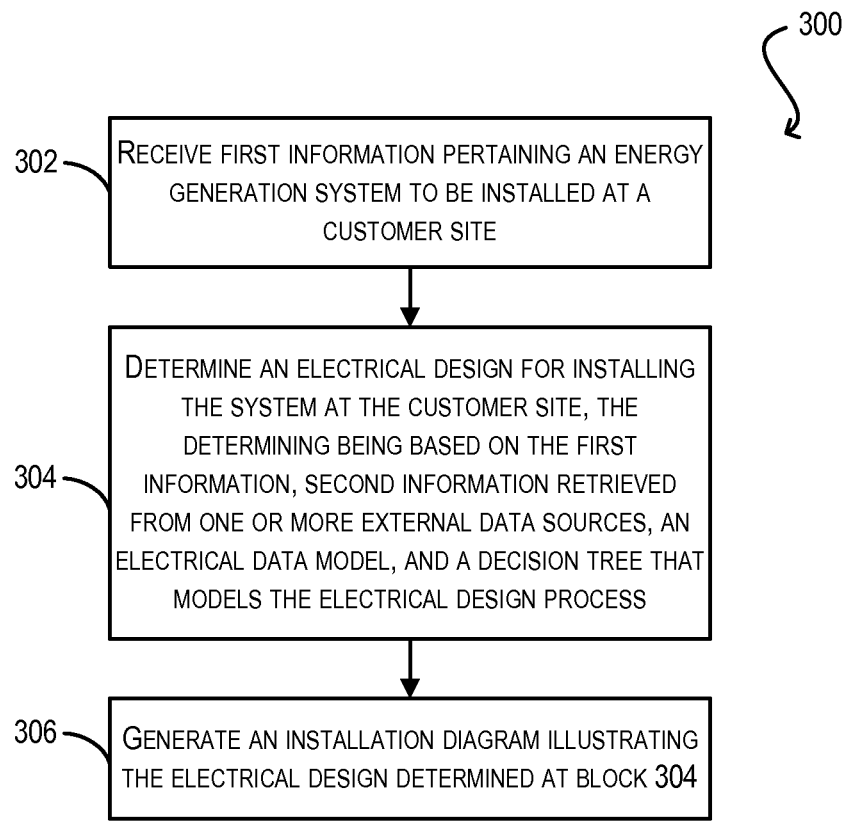
FIG. 3 is a flow diagram of a process for facilitating the electrical design of an energy generation system in accordance with an embodiment of the present invention.

FIG. 3 illustrates a process 300 that can be carried out by electrical design module 106 of FIG. 1 for facilitating the electrical design of an energy generation system according to an embodiment of the present invention. At block 302, electrical design module 106 can receive, from a user via graphical user interface 108, first information pertaining to an energy generation system to be installed at a customer site. In one embodiment, the first information can include various parameters that are specific to the installation site, such as whether certain electrical components are required (per AHJ/utility/state regulations), main panel information, utility meter information, grounding configuration, etc. The first information can also include information about certain core components of the system (e.g., energy generation components such as PV modules, PV inverters, etc.).

In some cases, a portion (or all) of the initial information may be available from one or more external data sources (e.g., data sources 114 of FIG. 1). In these situations, electrical design module 106 can automatically retrieve this information from data sources 114 prior to presenting graphical user interface 108 to the user, and can pre-populate the data entry fields of interface 108 with the retrieved information (as, e.g., "default" values). In some embodiments, the default values may be displayed as read-only values in interface 108, thereby preventing the user from making any changes. In other embodiments, the default values may be modifiable, thereby enabling the user to override the defaults with alternative values.

At block 304, electrical design module 106 can automatically determine an electrical design for installing the energy generation system at the customer site based on the first information received at block 302, second information retrieved from external data sources 114, electrical data model 110, and decision tree 112. As noted with respect to FIG. 1, electrical data model 110 can comprise a collection of data structures and/or rules defining how various electrical components physically connect with each other. Further, decision tree 112 can model a prototypical electrical design process, where each node in the tree corresponds to a decision/question to be resolved with respect to the electrical design, or a corresponding decision outcome. As part of the processing of block 304, electrical design module 106 can traverse the nodes of decision tree 112 such that a path of decision outcomes is defined. Electrical design module 106 can then determine, based on the decision outcomes and electrical data model 110, the content of the electrical design (i.e., the electrical components to be included in the design and the manner in which the components should be interconnected).

To resolve the decisions/questions encountered when traversing decision tree 112, electrical design module 106 can consult the first information received at block 302. If the necessary information was not provided at block 302, electrical design module can automatically attempt to retrieve it from one or more external data sources 114. In this manner, electrical design module 106 can minimize the need for further user input when generating the electrical design.

By way of example, assume a decision node of decision tree 112 requires information regarding whether rooftop DC disconnects are required for a given customer site. If this requirement information was not received as part of the first information of block 302, electrical design module 106 can attempt to retrieve it from one or more of external data sources 114. In this example, such a requirement (if it exists) would likely be stored in AHJ database 116 and/or state database 120. If, for whatever reason, the requirement information cannot be found in data sources 114, electrical design module 106 can prompt the user (via GUI 108) for an answer.

Once the electrical design has been determined per block 304, electrical design module 106 can generate, via CAD program 104, an installation diagram illustrating the determined design (block 306). In a particular embodiment, the installation diagram can be formatted as an electrical three-line diagram, with appropriate indicia illustrating the electrical components of the system and the connections between the components.

The diagram generated at block 306 can be used by a number of different entities for different purposes. For example, in one embodiment, the diagram can be used by one or more installation crews for constructing the system at the customer site. In another embodiment, the diagram can be submitted to local building authorities to facilitate permit approval. In yet another embodiment, the diagram can be submitted to a utility company for energy rebate qualification.

In a particular embodiment, the diagram can include a bill of materials comprising, e.g., the make/model number of each component and the wire sizes needed for the component connections. In these embodiments, the diagram can be provided to, e.g., a supply chain department to procure the necessary components for installation.

Additional details regarding the processing performed at each of the blocks of FIG. 3, along with other features and advantages of the present invention, are provided in the sections below.

Receiving Initial Information

Figure 4:
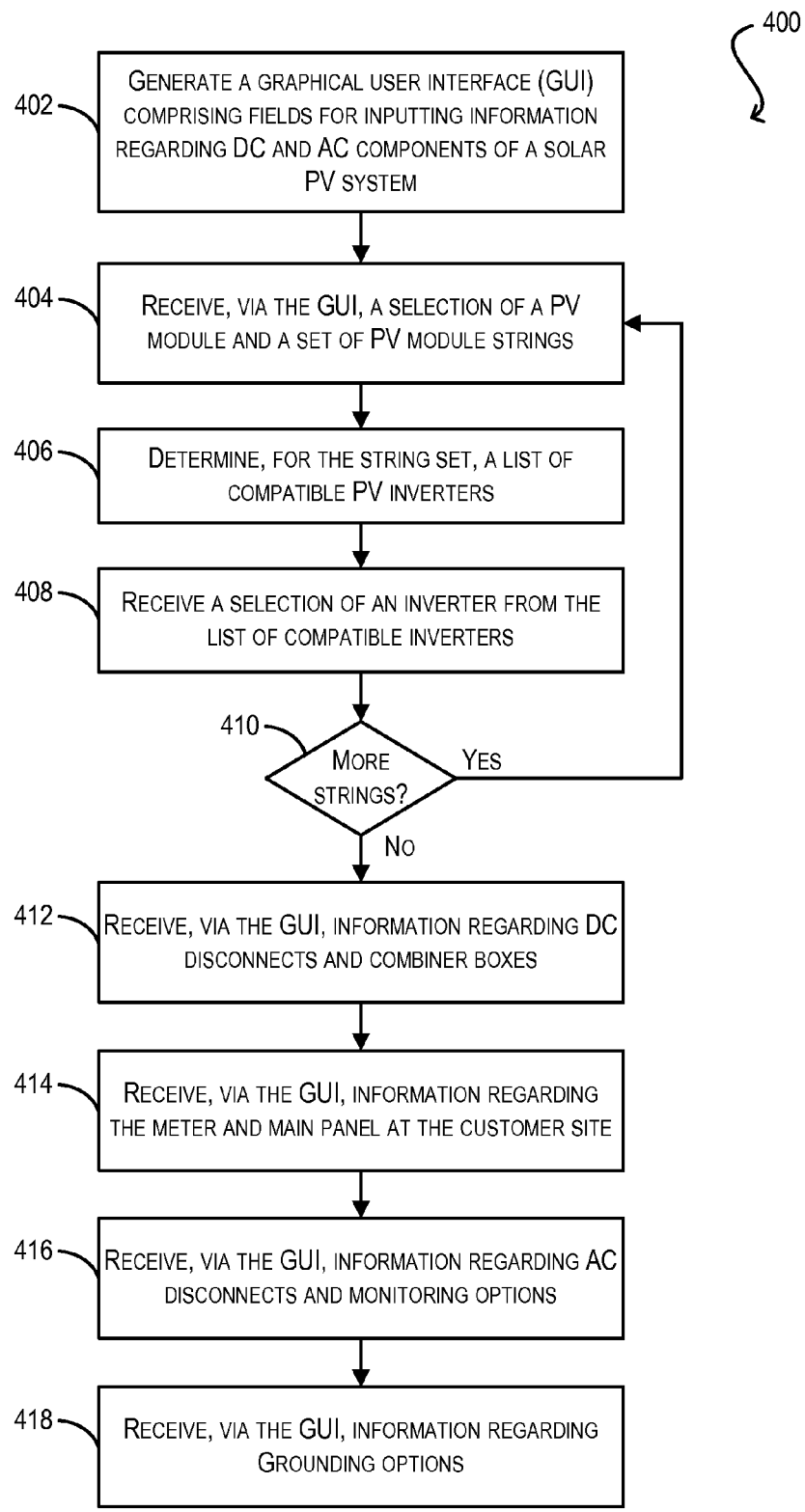
FIG. 4 is a flow diagram of a process for receiving user input pertaining to an electrical design in accordance with an embodiment of the present invention.

As discussed at block 302 of FIG. 3, electrical design module 106 can collect/receive initial information regarding an energy generation system to be installed at a customer site. The type of information collected at this step may vary depending on the type of system being installed. FIG. 4 illustrates an exemplary process 400 for performing this collection step with respect to a solar PV system according to an embodiment of the present invention.

Figure 5:
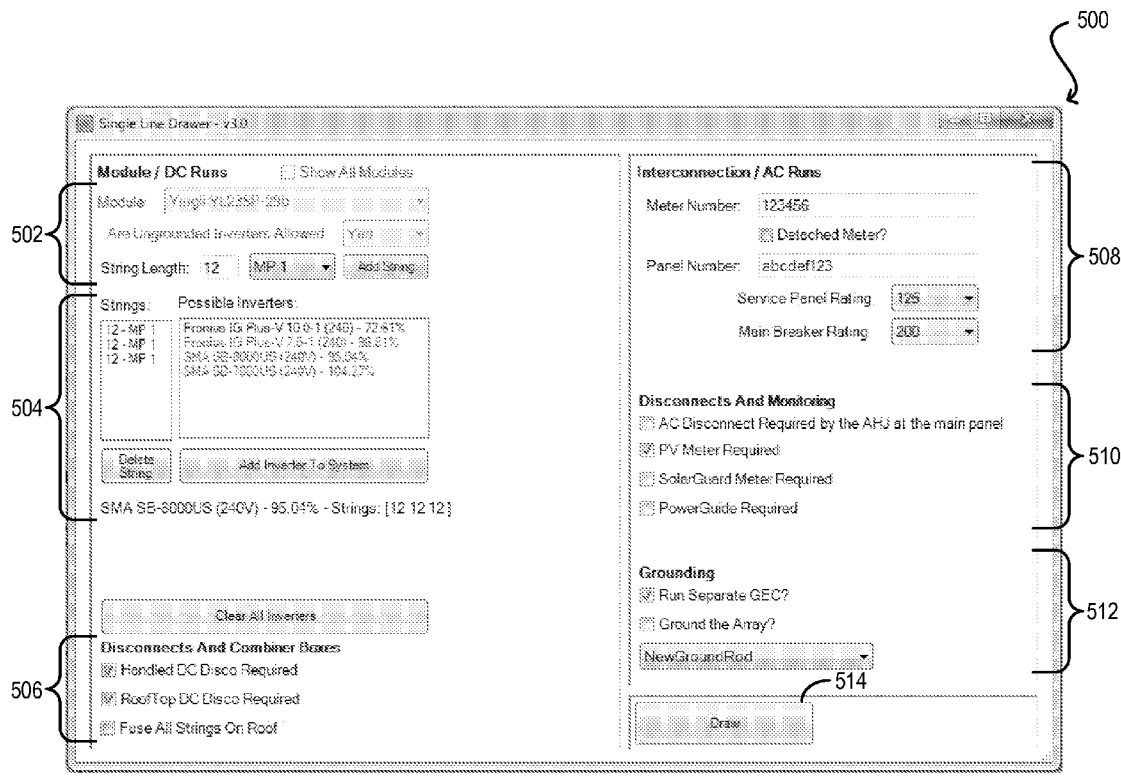
FIG. 5 is an example graphical user interface in accordance with an embodiment of the present invention.
Figure 6A:
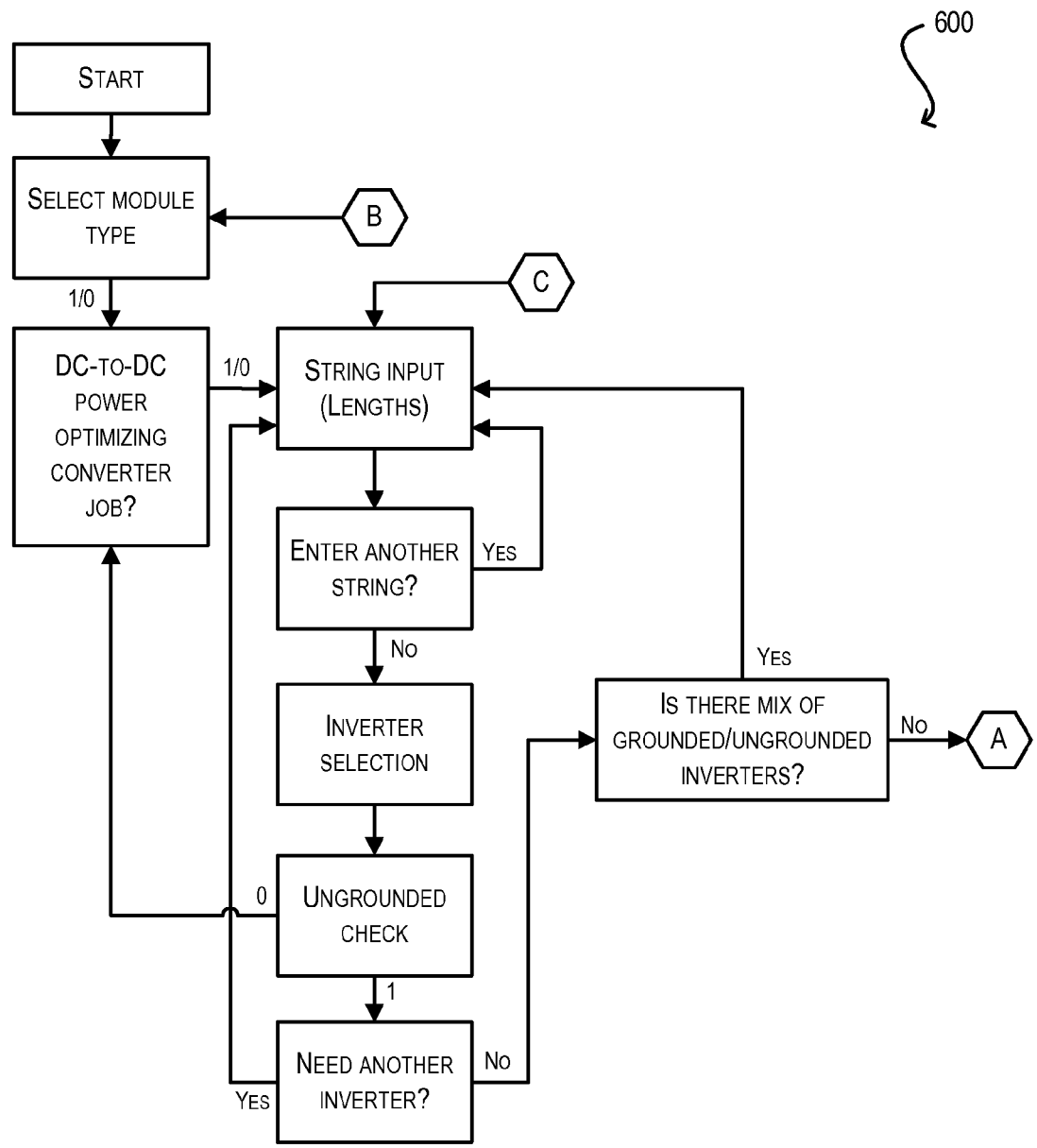
FIGS. 6A through 6G are flow diagrams illustrating an example decision tree in accordance with an embodiment of the present invention.
Figure 6B:
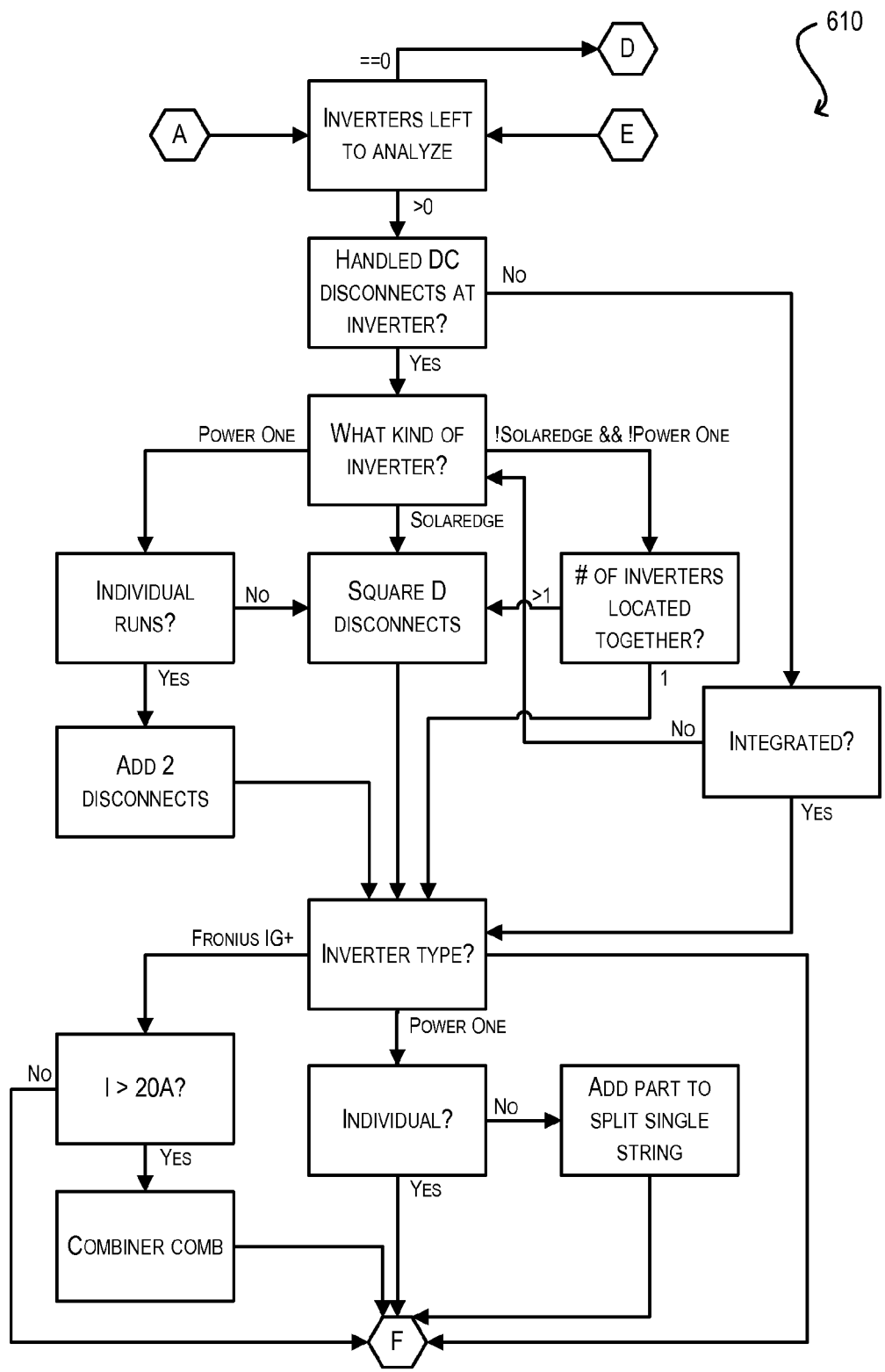
Figure 6C:
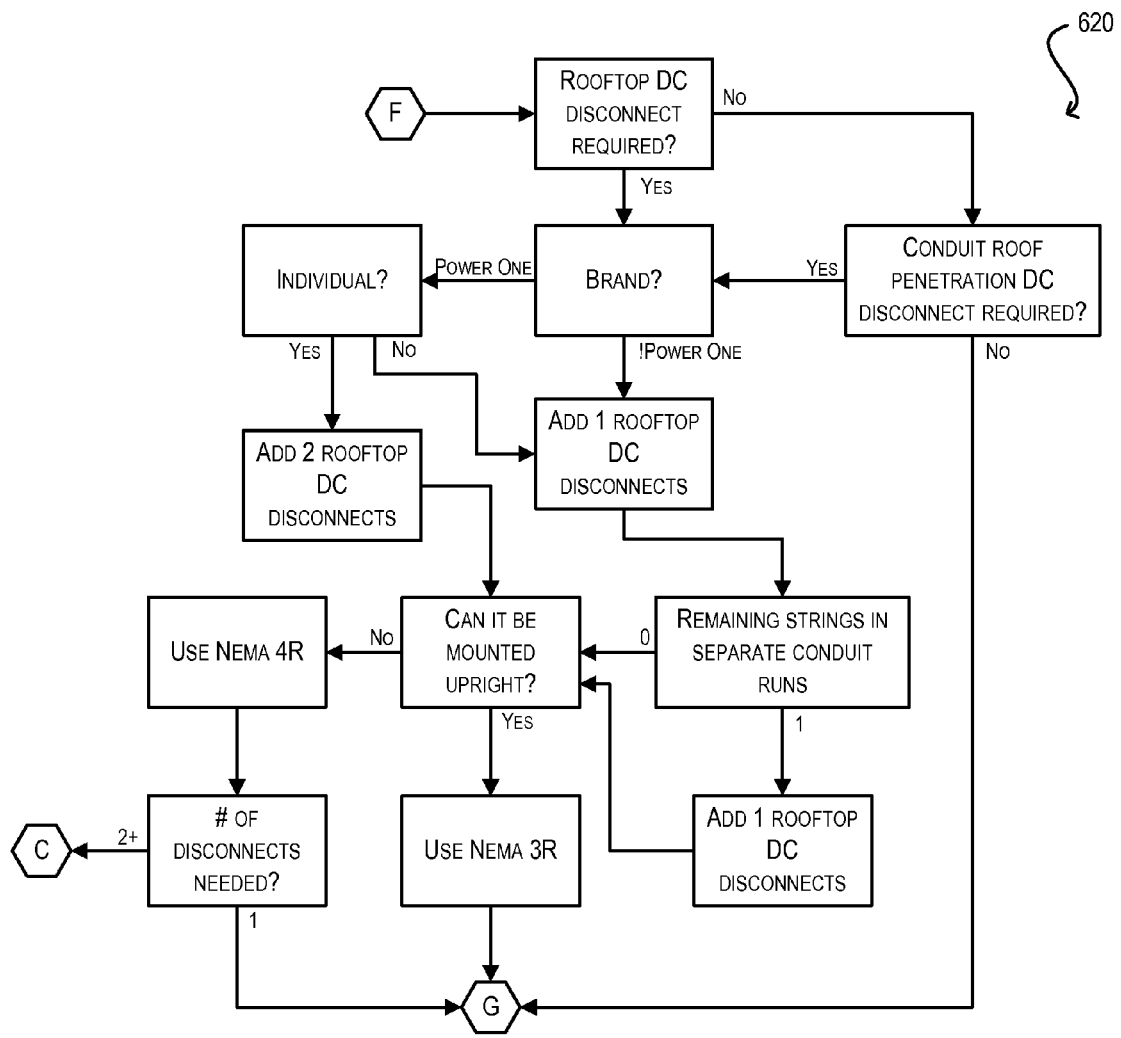
Figure 6D:
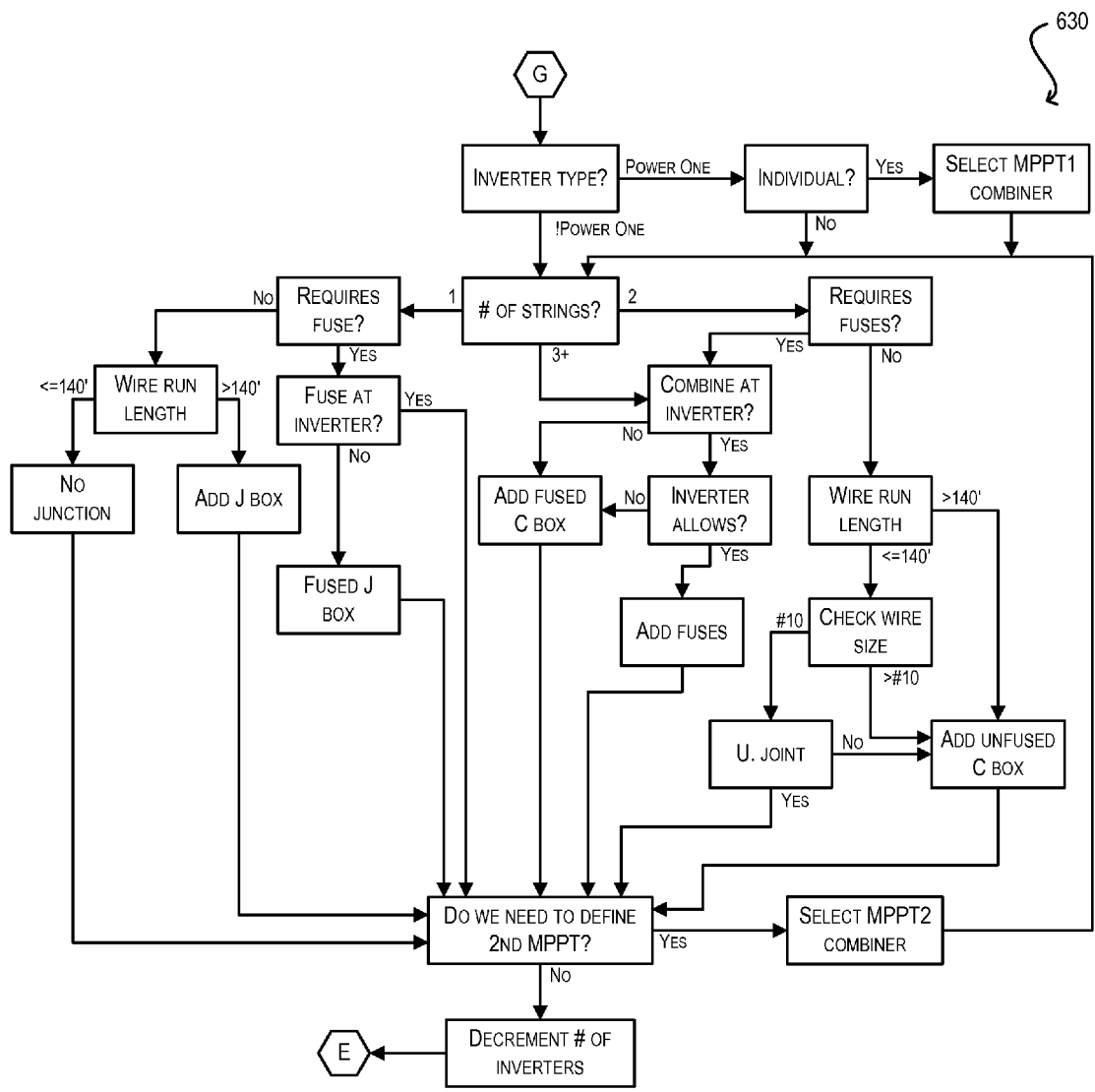
Figure 6E:
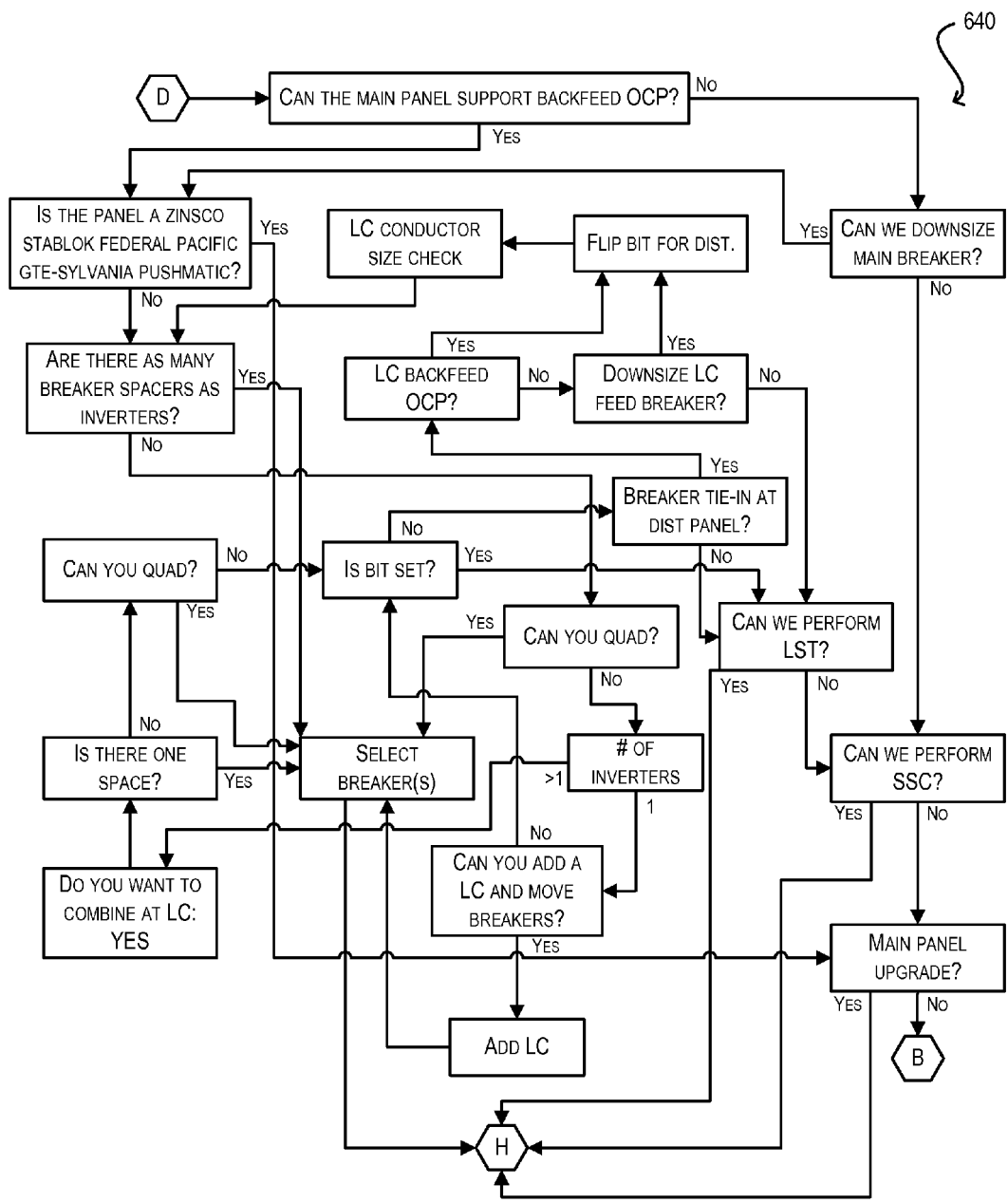
Figure 6F:
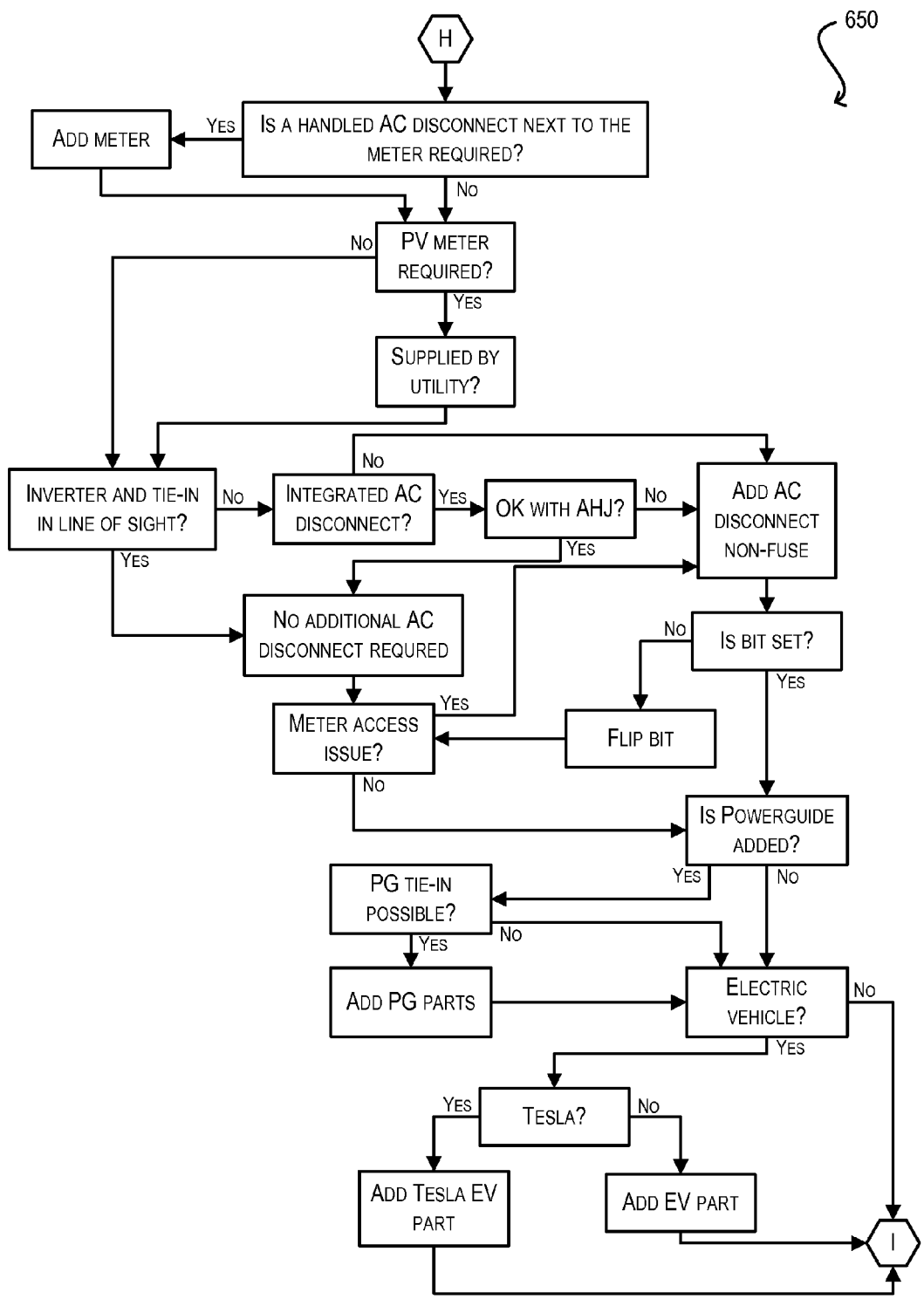
Figure 6G:
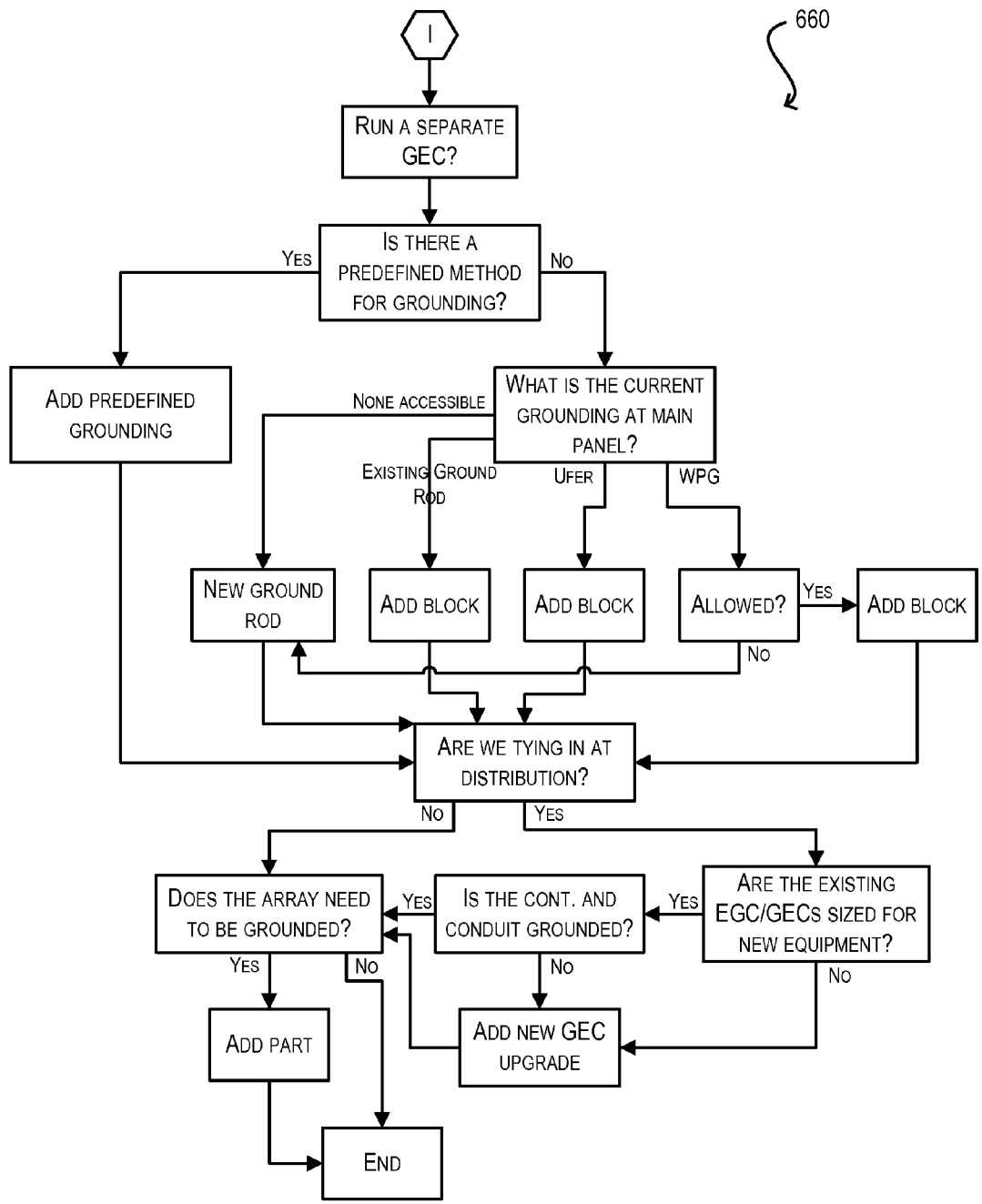

At block 402, electrical design module 106 can generate a GUI comprising fields for inputting information regarding the DC and AC components of a PV system. An example of such a GUI 500 is depicted in FIG. 5. In the embodiment of FIG. 5, sections 502, 504, and 506 of GUI 500 correspond to the DC side of the PV system, and sections 508, 510, and 512 of GUI 500 correspond to the AC side of the PV system.

The remaining blocks of process 400 describe the specific types of information that may be collected via GUI 500 with respect to the PV system. For instance, at block 404, electrical design module 106 can receive, via GUI 500, a selection of a PV module and a corresponding set of module strings. This information can be entered at, e.g., section 502 of GUI 500. As shown in FIG. 5, the "Add String" button can be used to define multiple strings for a single module type.

At block 406, electrical design module 106 can determine a list of compatible PV inverters for the set of strings entered at block 404. Such a list is illustrated in user interface 500 at section 504. As shown, each inverter can be color-coded to represent the percentage of its capacity that would be used for the string set. In addition, this capacity percentage can be displayed in text next to the inverter name. In certain embodiments, the list of inverters determined at block 406 can be retrieved from a component supply chain database (e.g., database 122 of FIG. 1). Further, the list can be filtered in view of a number of different criteria, such as such as supply chain availability/demand, cost, location of the customer site, customer preference, and the like. Thus, in these embodiments, electrical design module 106 can tailor the inverter list to only include specific models that it deems to be appropriate (based on cost, availability, etc.) for the current system installation.

Once the list of inverters has been presented to the user, electrical design module 106 can receive, at block 408, a selection of a particular inverter from the list (via the "Add Inverter to System" button shown in section 504 of FIG. 5). If the user determines that additional strings and inverters need to be added to the system (block 410), process 400 can return to block 404. Otherwise, process 400 can proceed to block 412.

Blocks 412 through 418 are steps for receiving information regarding the balance of the DC and AC components of system. For example, at block 412, electrical design module 106 can receive information regarding required DC disconnects and combiner boxes (via section 506 of GUI 500). And at blocks 414-418, electrical design module 106 can receive information regarding the main panel/utility meter, AC disconnects and monitoring options, and grounding options (via sections 508, 510, and 512 of GUI 500 respectively).

In certain embodiments, some (or all) of the information described with respect to blocks 412-418 may be available in one or more of external data sources 114, such as AHJ database 116, utility database 118, state database 120, and so on.

In these embodiments, electrical design module 106 can retrieve the information from data sources 114 and pre-populate the retrieved information in the fields of GUI 500 as default values. In one embodiment, the default values may be displayed as read-only values in GUI 500, thereby preventing the user from making any changes. In another embodiment, the default values may be modifiable, thereby enabling the user to override the defaults with alternative values.

Generating the Electrical Design

Once the various sections of GUI 500 have been filled in, the user can activate the "Draw" button (514) of GUI 500 to begin the electrical design generation process. As described with respect to block 304 of FIG. 3, this process can include traversing a decision tree (e.g., 112 of FIG. 1) that models the decision making flow for generating the electrical design. FIGS. 6A through 6G illustrate an example decision tree (comprising flow diagrams 600-660) for generating the electrical design of a PV system according to an embodiment of the present invention. It should be appreciated that the decision tree of FIGS. 6A-6G is provided for illustration purposes only, and is not intended to limit embodiments of the present invention. For example, although certain brands of PV inverters are referenced in the decision tree, one of ordinary skill in the art will recognize that other brands and corresponding decision paths may be supported.

While traversing the decision tree of FIGS. 6A-6G, electrical design module 106 can refer to the initial information collected via user interface 500, as well as query additional information from external data sources 114, to answer the various questions that may be encountered (e.g., "Is a DC disconnected required?" or "Is a separate Grounding Electrode Conductor (GEC) required?"). Any information that cannot be determined from the initial information or the data in external data sources 114 can be directly requested (via, e.g., a dialog box or other input interface) from the user. Once a path has been defined through the decision tree, electrical design module 106 can apply an electrical data model (e.g., 110 of FIG. 1) to determine how the various electrical components of the design should be physically connected. This can ensure that the resulting design is compliant with all appropriate standards and regulations.

Figure 7:
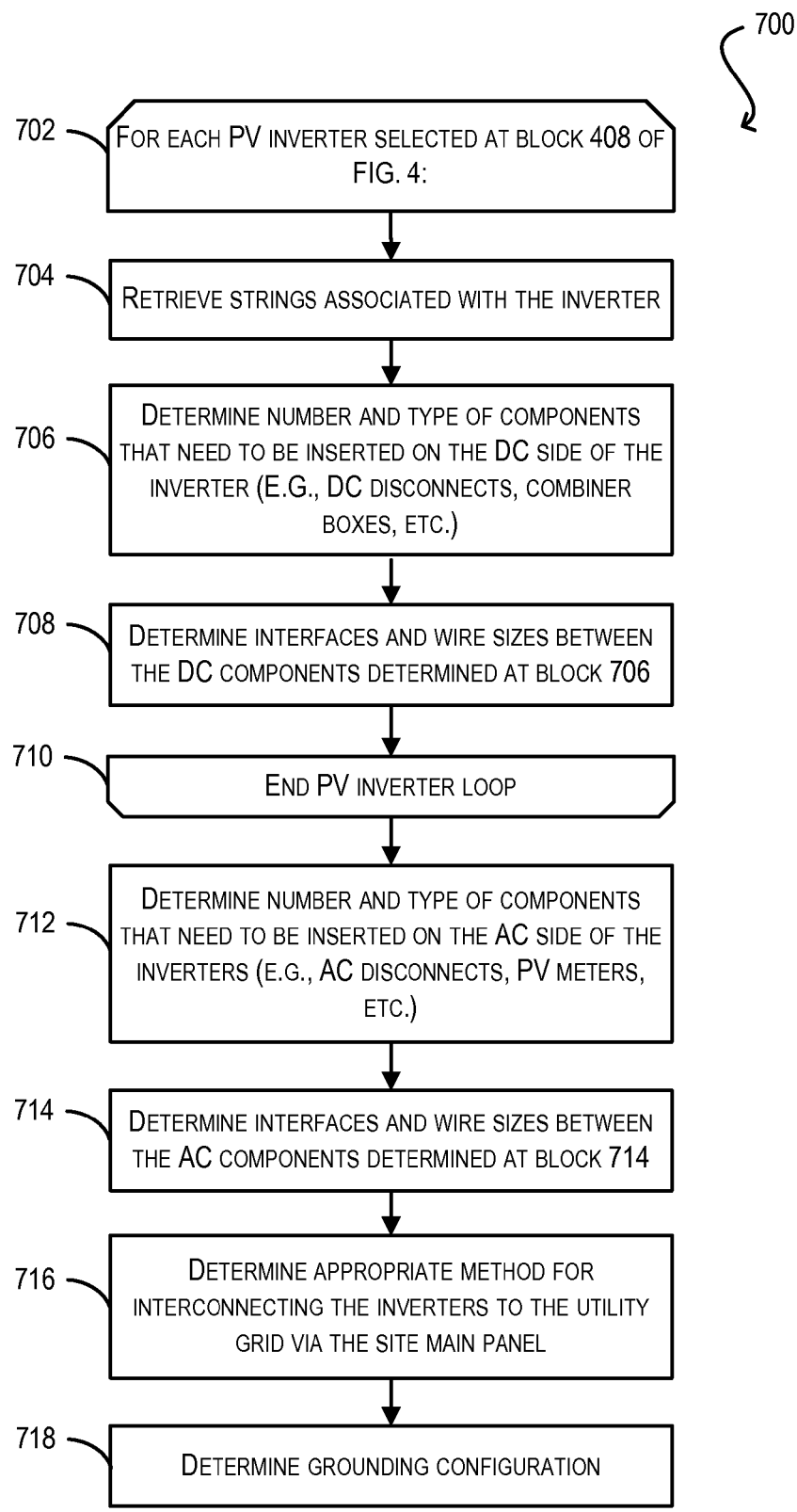
FIG. 7 is a flow diagram summarizing the decision tree processing of FIGS. 6A-6G in accordance with an embodiment of the present invention.

FIG. 7 illustrates a process 700 that summarizes, at a high level, the decision making process carried out by the decision tree of FIGS. 6A-6E. At block 702, the decision tree can enter a loop for each PV inverter selected at block 408 of FIG. 4. At blocks 704-708, the decision tree can resolve the DC side of the PV system. In particular, the decision tree can retrieve the PV module strings associated with the PV inverter, determine the number and type of components that should be inserted on the DC side of the PV inverter (e.g., DC disconnects, combiner boxes, etc.), and determine the interfaces and wire sizes to be used between the DC components. Blocks 704-708 can be repeated until all of the PV inverters in the system have been processed (block 710).

At blocks 712 and 714, the decision tree can resolve the AC side of the PV system. In particular, at block 712, the decision tree can determine the number and types of components that should be inserted on the AC side of the PV inverters (e.g., AC disconnects, PV meters, etc.).

And at block 714, the decision tree can determine the interfaces and wire sizes to be used between the AC components.

Once the DC and AC components of the system have been resolved, the decision tree can determine the appropriate method for interconnecting the PV system (in particular, the PV inverters) to the utility grid via the site's main panel (block 716). This will vary depending on the layout of the site and the make and model of the main panel.

Finally, the decision tree can determine the grounding configuration for the system (block 718).

The Installation Diagram

Figure 8A:
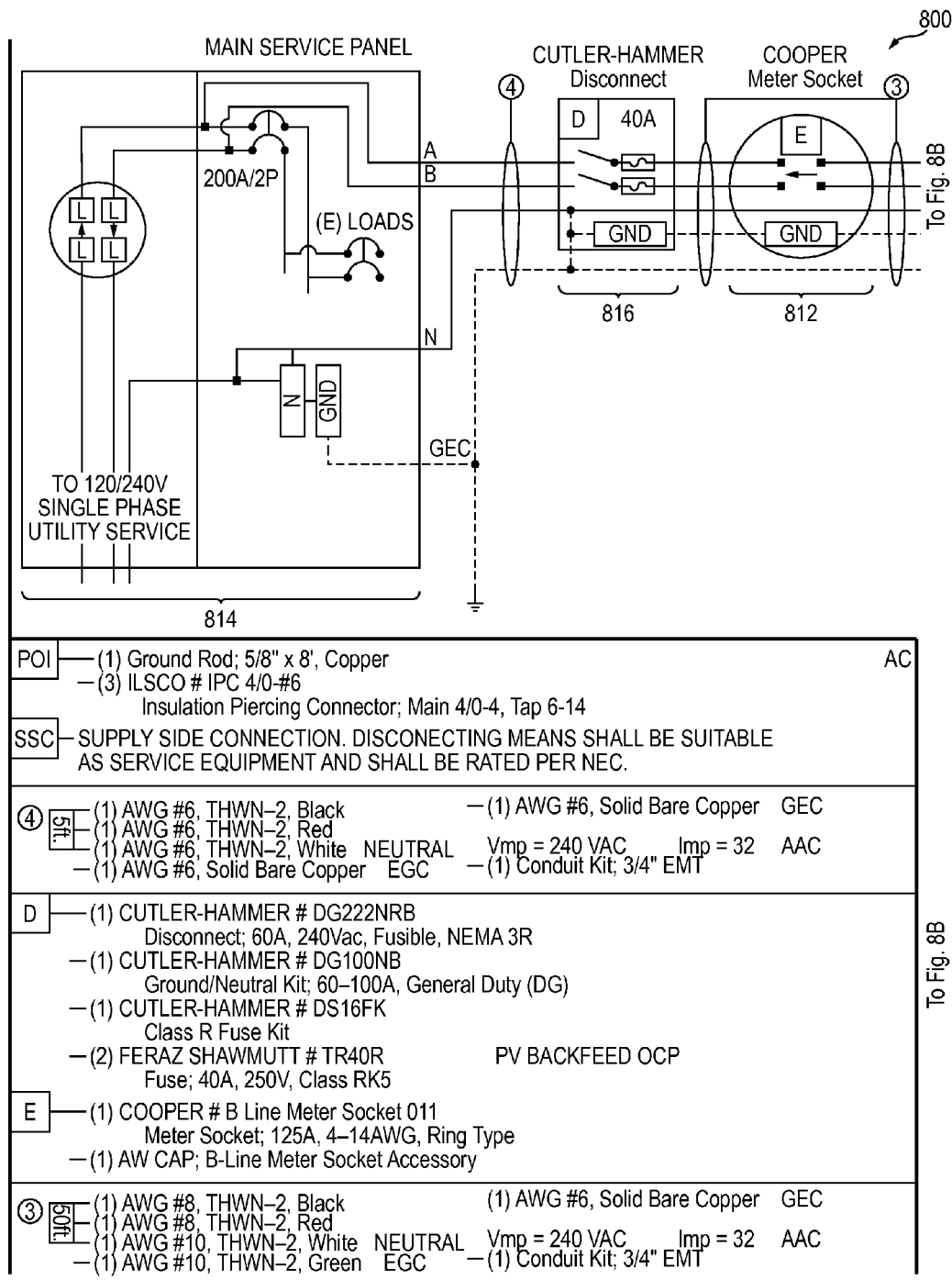
FIGS. 8A and 8B illustrate an example installation diagram in accordance with an embodiment of the present invention.
Figure 8B:
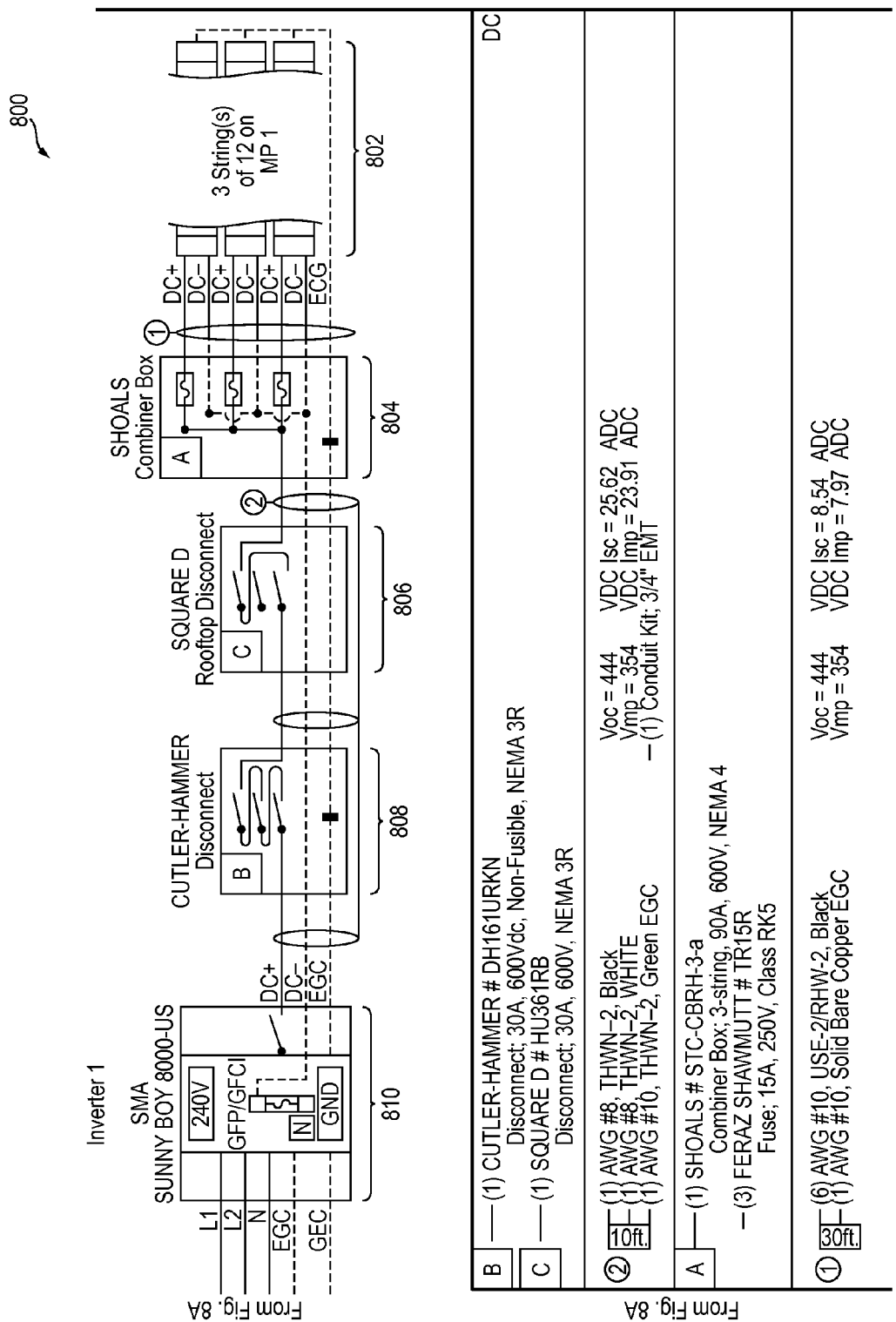

FIGS. 8A and 8B illustrate an installation diagram 800 for a PV system that may be generated by electrical design module 106 (via CAD program 104) subsequently to the decision tree processing of FIG. 7. As shown, diagram 800 depicts the various electrical components of the PV system, as well as the interconnections/conduits between each component. For example, on the DC side (shown in FIG. 8B), PV module strings 802 are connected to DC combiner box 804. DC combiner box 804 is, in turn, connected to two DC disconnects (rooftop disconnect 806 and disconnect 808), which lead to PV inverter 810. On the AC side (shown in FIG.8A), PV inverter 810 is connected to meter socket 812, which is connected to main service panel 814 via AC disconnect 816. Note that diagram 800 specifically illustrates how the PV inverter power lines are tied into the breakers of main panel 814.

In the embodiment of FIGS. 8A and 8B, diagram 800 is organized such that the DC components of the system (802-810) are grouped on the right side of the diagram (shown in FIG. 8B), while the AC components of the system (812-816) are grouped on the left side of the diagram (shown in FIG. 8A). This can facilitate installation of the components at the customer site. For instance, in many cases, one installation crew will work on installing the DC side of the system while another installation crew will simultaneously work on installing the AC side of the system. By organizing diagram 800 in the manner shown, the diagram can be conveniently split in half and provided to the appropriate crew for installation.

Further, diagram 800 includes, along the bottom half, a BOM that lists the make and model numbers of the components depicted in the diagram, as well information regarding the wires needed to connect the components (e.g., wire size and type). Thus, all of the information needed to procure the electrical components (and their interconnecting wires) from the supply chain can be gleaned directly from the diagram itself, rather than being collected from other sources/locations. As shown, each section of the BOM is marked by a designator (A, B, C, etc.) indicating which component that section maps to in the illustration above. As noted previously, the BOM information can be included in metadata associated with diagram 800 (in addition to being displayed on the diagram). This information can then be transferred directly into, e.g., an inventory management system.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, although certain embodiments have been described with respect to particular process flows and steps, it should be apparent to those skilled in the art that the scope of the present invention is not strictly limited to the described flows and steps. Steps described as sequential may be executed in parallel, order of steps may be varied, and steps may be modified, combined, added, or omitted. As another example, although certain embodiments have been described using a particular combination of hardware and software, it should be recognized that other combinations of hardware and software are possible, and that specific operations described as being implemented in software can also be implemented in hardware and vice versa.

The specification and drawings are, accordingly, to be regarded in an illustrative rather than restrictive sense. Other arrangements, embodiments, implementations and equivalents will be evident to those skilled in the art and may be employed without departing from the spirit and scope of the invention as set forth in the following claims.

What is claimed is:

1. A method comprising:
   receiving, by a computer system from a user, first information pertaining to an energy generation system to be installed at a customer site;
   determining, by the computer system, an electrical design for installing the energy generation system at the customer site, the determining being based on the first information, second information retrieved from one or more external data sources, an electrical data model, and a decision tree modeling an electrical design process, the decision tree comprising a series of decisions and decision outcomes that guide the computer system on what electrical components are needed to implement the energy generation system and how the electrical components should be interconnected, the electrical components comprising at least one inverter, one or more alternating current (AC) components, and one or more direct current (DC) components; and
   generating, by the computer system, an installation diagram illustrating the determined electrical design.

2. The method of claim 1 wherein the energy generation system is a solar photovoltaic (PV) system.

3. The method of claim 1 wherein the first information is received via a graphical user interface (GUI).

4. The method of claim 3 wherein the first information includes information pertaining to the one or more DC components.

5. The method of claim 3 wherein the first information further includes information pertaining to the one or more AC components.

6. The method of claim 3 wherein a portion of the first information is populated with defaults retrieved from the one or more external data sources.

7. The method of claim 6 wherein the one or more external data sources are selected from a group consisting of: an Authority Having Jurisdiction (AHJ) database, a utility database, a state database, and a component supply chain database.

8. The method of claim 1 wherein the electrical data model comprises a plurality of rules indicating how electrical components of the energy generation system may be interconnected, the plurality of rules conforming to the National Electric Code (NEC).

9. The method of claim 1 wherein determining the electrical design comprises traversing nodes of the decision tree, each node representing a decision or a decision outcome.

10. The method of claim 9 wherein the method further comprises, for a given node of the decision tree representing a decision:
    determining whether the decision can be automatically determined by the computer system based on the first information or the second information; and
    if the question cannot be automatically determined based on the first information or the second information, prompting the user for an answer.

11. The method of claim 1 wherein the electrical design includes information regarding how the electrical components should be interconnected.

12. The method of claim 11 wherein the information regarding how the electrical components should be interconnected include information regarding conduit to be used between the electrical components.

13. The method of claim 1 wherein the installation diagram is configured such that AC components of the energy generation system are depicted on one side of the installation diagram and DC components of the energy generation system are depicted on the opposite side of the installation diagram.

14. The method of claim 1 wherein the installation diagram includes a bill of materials.

15. The method of claim 14 wherein the bill of materials identifies make and model numbers for each electrical component of the energy generation system.

16. The method of claim 15 wherein the bill of materials further identifies sizes of wires needed to interconnect the electrical components.

17. The method of claim 1 wherein the installation diagram is generated using a computer-aided design (CAD) program, and wherein the receiving and determining are performed by a plug-in module to the CAD program.

18. A system comprising:
    a processor configured to:
        receive, from a user, first information pertaining to an energy generation system to be installed at a customer site;
        determine an electrical design for installing the energy generation system at the customer site, the determining being based on the first information, second information retrieved from one or more external data sources, an electrical data model, and a decision tree modeling an electrical design process, the decision tree comprising a series of decisions and decision outcomes that guide the computer system on what electrical components are needed to implement the energy generation system and how the electrical components should be interconnected, the electrical components comprising at least one inverter, one or more alternating current (AC) components, and one or more direct current (DC) components; and
        generate an installation diagram illustrating the determined electrical design.

19. A non-transitory computer-readable storage medium having stored thereon program code executable by a computer system, the program code comprising:
    code that causes the computer system to receive, from a user, first information pertaining to an energy generation system to be installed at a customer site;
    code that causes the computer system to determine an electrical design for installing the energy generation system at the customer site, the determining being based on the received information, second information retrieved from one or more external data sources, an electrical data model, and a decision tree modeling an electrical design process, the decision tree comprising a series of decisions and decision outcomes that guide the computer system on what electrical components are needed to implement the energy generation system and how the electrical components should be interconnected, the electrical components comprising at least one inverter, one or more alternating current (AC) components, and one or more direct current (DC) components; and
    code that causes the computer system to generate an installation diagram illustrating the determined electrical design.

20. The non-transitory computer-readable storage medium of claim 19 wherein the program code comprises code for a plug-in module to a CAD program.

\* \* \* \* \*